United States Patent
Kim

(10) Patent No.: US 10,773,955 B2
(45) Date of Patent: Sep. 15, 2020

(54) COMPOSITE MATERIAL CONTAINING GRAPHENE

(71) Applicant: The Boeing Company, Chicago, IL (US)

(72) Inventor: Namsoo P. Kim, Bellevue, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/904,274

(22) Filed: Feb. 23, 2018

(65) Prior Publication Data

US 2018/0179056 A1    Jun. 28, 2018

Related U.S. Application Data

(63) Continuation of application No. 14/268,052, filed on May 2, 2014, now Pat. No. 9,932,226.

(51) Int. Cl.

| | |
|---|---|
| *B82Y 30/00* | (2011.01) |
| *H01B 1/04* | (2006.01) |
| *H01B 1/24* | (2006.01) |
| *F28F 21/02* | (2006.01) |
| *F28F 21/08* | (2006.01) |
| *C09K 5/14* | (2006.01) |
| *H01L 23/373* | (2006.01) |

(52) U.S. Cl.
CPC ............... *B82Y 30/00* (2013.01); *C09K 5/14* (2013.01); *F28F 21/02* (2013.01); *F28F 21/081* (2013.01); *H01B 1/04* (2013.01); *H01B 1/24* (2013.01); *H01L 23/373* (2013.01); *H01L 23/3736* (2013.01); *H01L 23/3737* (2013.01); *H01L 2924/0002* (2013.01)

(58) Field of Classification Search
CPC ............. B82Y 30/00; H01B 1/04; H01B 1/24
USPC ........ 252/510, 511, 500; 977/734, 778, 788, 977/832
See application file for complete search history.

(56) References Cited

U.S. PATENT DOCUMENTS

| | | |
|---|---|---|
| 8,263,843 B2 | 9/2012 | Kim et al. |
| 2004/0033189 A1* | 2/2004 | Kaschak ............... B82Y 30/00 423/448 |
| 2007/0158618 A1 | 7/2007 | Song et al. |
| 2011/0042649 A1 | 2/2011 | Duvall et al. |

(Continued)

FOREIGN PATENT DOCUMENTS

WO   WO2014/055802 A2 †  4/2014

OTHER PUBLICATIONS

Zhao "Enhanced Mechanical Properties of Graphene-Based Poly(vinyl alcohol) Composites." Macromolecules 2010, 43, 2357-2363. (Year: 2010).*

(Continued)

*Primary Examiner* — Tri V Nguyen
(74) *Attorney, Agent, or Firm* — MH2 Technology Law Group LLP

(57) ABSTRACT

In one aspect, a composite material is disclosed herein that includes graphene platelets dispersed in a matrix. In some cases, the graphene platelets are randomly oriented within the matrix. The composite material can provide improved thermal conductivity and may be formed into heat spreaders or other thermal management devices to provide improved cooling to electronic, electrical components and semiconductor devices.

20 Claims, 1 Drawing Sheet

(56) References Cited

U.S. PATENT DOCUMENTS

| | | | |
|---|---|---|---|
| 2012/0077017 A1 | 3/2012 | Buresch et al. | |
| 2014/0224466 A1 | 8/2014 | Lin et al. | |
| 2014/0374267 A1 | 12/2014 | Monteiro et al. | |
| 2015/0305212 A1* | 10/2015 | Sarto | H01Q 17/00 252/511 |

OTHER PUBLICATIONS

Polschikov "Composite Materials of Graphene Nanoplatelets and Polypropylene, Prepared by in Situ Polymerization." J. Appl. Polym. Sci. 2013, DOI: 10.1002/APP.37837 (Year: 2012).*

King "Characterization of exfoliated graphite nanoplatelets/polycarbonate composites:electrical and thermal conductivity, and tensile , flexural, and rheological." Journal of Composite Materials 46(9) 1029-1039 (Year: 2011).*

Potts "Graphene-based polymer nanocomposites." Polymer 52 (2011) 5-25 (Year: 2011).*

XGnP website https://xgsciences.com/materials/graphene-nano-platelets/ accessed Nov. 19, 2019. (Year: 2019).*

Via "Effects of Multiple Carbon Fillers on the Rheology of Polycarbonate-Based Composites." Polymer Composites.vol. 33, Issue 2 Feb. 2012. (Year: 2012).*

Du "The Fabrication, Properties, and Uses of Graphene/Polymer Composites." Macromol. Chem. Phys. 2012, 213, 1060-1077 (Year: 2012).*

Chu et al., "Enhanced Strength in Bulk Graphene-Copper Composites," Phys. Status Solid A, No. 1, (2014) 184-190.

Rashad et al., "Effect of Graphene Nanoplatelets Addition on Mechanical Properties of Pure Aluminum Using a Semi-Powder Method," Progress in Natural Science: Materials International 24, (2014) 101-108.

Graf et al., "Spataily Resolved Raman Spectroscopy of Single- and Few-Layer Graphene," Nano Letters, (2007), vol. 7, No. 2, 238-242.

Wang et al., "Reinforcement With Graphene Nanosheets in Aluminum Matrix Composites," Scripta Materialia, 66, (2012) 594-597.

Chen et al., "Novel Nanoprocessing Route for Bulk Graphene Nanoplatelets Reinforced Metal Matrix Nanocomposites," Scripta Materialia, 67 (2012) 29-32.

Bastwros et al., "Effect of Ball Milling on Graphene Reinforced Al6061 Composite Fabricated by Semi-Solid Sintering," Composites: Part B, 60, (online Dec. 31, 2013) 111-118.

H. Fukushima, Thermal Conductivity of Exfoliated Graphite Nanocomposites, Published at least as early as Jul. 26, 2006, Journal of Thermal Analysis and Calorimetry, vol. 85 (2006) 1, pp. 235-238, Published by Akademiai Kiado, Hungary, Netherlands.†

L. Monica Veca, Carbon Nanosheets for Polymeric Nanocomposites with High Thermal Conductivity, Published at least as early as May 21, 2009, Advanced Materials, 2009, 21, pp. 2088-2092, Published by Wiley-VCH Verlag GmbH & Co., USA and Germany.†

S. Ghose, Thermal Conductivity of UltemTM/Carbon Nanofiller Blends, Published at least as early as 2006, High Performance Polymers, 2006 18: pp. 961-977, Published by Sage Publications, USA.†

Aiping Yu, Graphite Nanoplatelet—Epoxy Composite Thermal Interface Materials, Published at least as early as May 10, 2017, The Journal of Physical Chemistry, 2007, 111, pp. 7565-7569, Published by American Chemical Society, USA.†

Shin-Yi Yang, Synergetic effects of graphene platelets and carbon nanotubes on the mechanical and thermal properties of epoxy composites, Published at least as early as Nov. 13, 2010, Carbon 49 (2011) pp. 793-803, Published by Elsevier Ltd., USA.†

H.T. Hahn, Graphite Nanoplatelet Composites and their Applications, Published at least as early as 2011, Composite Materials A Vision for the Future, Chapter 7, pp. 169-186, Published by Springer, UK.†

* cited by examiner
† cited by third party

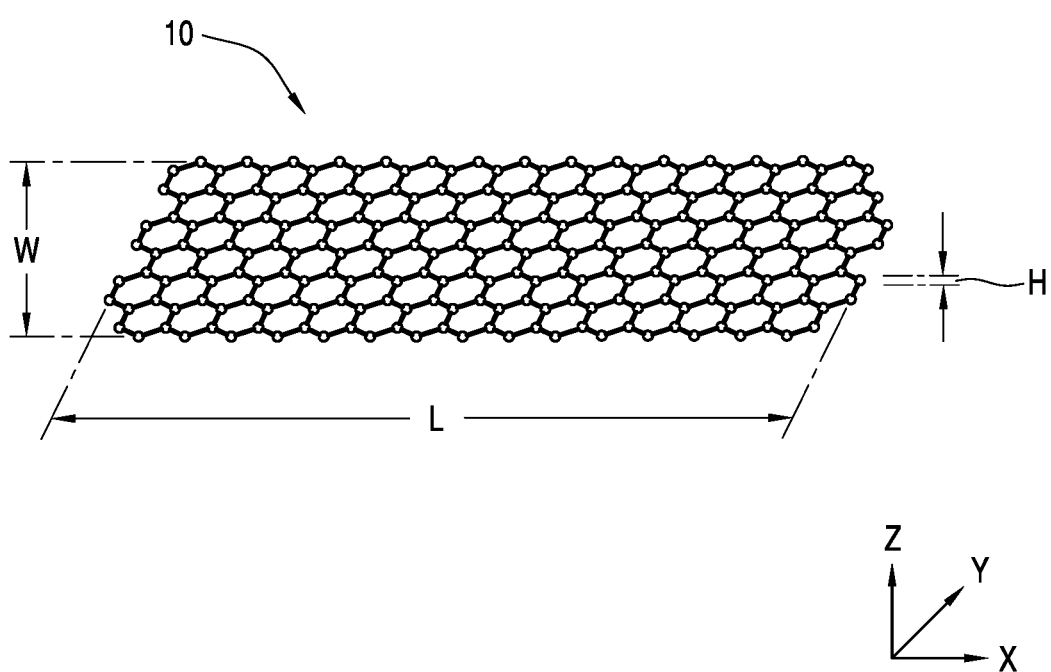

US 10,773,955 B2

COMPOSITE MATERIAL CONTAINING GRAPHENE

CROSS REFERENCE TO RELATED APPLICATIONS

This application is a continuation application of co-pending patent application Ser. No. 14/268,052 filed May 2, 2014, entitled COMPOSITE MATERIAL CONTAINING GRAPHENE, now allowed, which is incorporated herein by referenced in its entirety.

FIELD

This disclosure relates generally to composite materials, and more particularly, to matrix composites comprising graphene nanoparticles.

BACKGROUND

Composite materials, also called composition materials or composites, are materials made from two or more constituent materials with significantly different physical and/or chemical properties. When the two or more constituent materials are combined, a material is produced with characteristics different from the individual components. The new material may be preferred for many reasons. Common examples include materials which are stronger, lighter or less expensive when compared to traditional materials.

Graphene includes $sp^2$-bonded carbon as a primary carbon component, as opposed to $sp^3$-bonded carbon. For example, a graphene sheet is a one-atom-thick planar sheet of $sp^2$-bonded carbon atoms that are densely packed in a honeycomb crystal lattice. Graphene-based materials have been combined with other materials to form composites, but some such composites can be tedious and/or expensive to manufacture. In addition, some such composites can exhibit one or more properties that are not suitable for some applications. Therefore, improved graphene-containing composite materials are needed.

SUMMARY

According to one aspect of the present disclosure, a composite material comprises a matrix and graphene particles dispersed within the matrix, wherein the graphene particles are randomly oriented in the matrix. Such a composite material can provide improved thermal conduction properties and/or improved ease of fabrication compared to some other composite materials, including other composite materials used for thermal management applications.

According to a further aspect, the matrix is thermally conductive, and comprises a metal. In a still further variation, the matrix comprises or is formed from a metal selected from the group including aluminum, aluminum alloys, copper, copper alloys, titanium, titanium alloys, stainless steel, brass, and combinations thereof. In some cases, the matrix comprises or is formed from a polymeric material, such as a thermoset polymeric material or a thermoplastic polymeric material.

Moreover, in some implementations, the graphene particles of a composite material described herein are provided as a plurality of graphene platelets, and the composite comprises from about 1 volume % to about 40 volume % or from about 1 volume % to about 20 volume % graphene, based on the total volume of the composite. In a further aspect, the graphene platelets have an average thickness of about 0.3 nm to about 1 nm, about 1 nm to about 100 nm, about 1 nm to about 10 nm, about 1 nm to about 300 nm, or about 1 nm to about 1000 nm.

In another aspect, the present disclosure is directed to a thermally conductive material comprising or formed from a composite material described herein. Still further, the present disclosure is directed to thermally conductive components including thermally conductive materials comprising or formed from a composite material described herein. In some implementations, the thermally conductive component is a heat spreader, a heat sink, or another thermal management component. Thus, the present disclosure is also directed to thermal management and thermal conduction applications.

Other features and advantages of the present disclosure will be apparent from the following more detailed description of variations, taken in conjunction with the accompanying drawing that illustrate, by way of example, the principles of the disclosure.

BRIEF DESCRIPTION OF THE DRAWING

FIG. 1 illustrates an exemplary graphene sheet according to one implementation described herein.

DETAILED DESCRIPTION

Implementations described herein can be understood more readily by reference to the following detailed description, examples, and drawing. Elements, apparatus, and methods described herein, however, are not limited to the specific implementations presented in the detailed description, examples, and drawing. It should be recognized that these implementations are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

In one aspect, composite materials are described herein. In some implementations, a composite material comprises, consists, or consists essentially of a matrix and graphene platelets dispersed in the matrix, wherein the graphene platelets are randomly oriented in the matrix.

Turning now to specific components of composite materials, composite materials described herein comprise a matrix. In some cases, the matrix is thermally conductive. Moreover, a matrix can comprise or be formed from any material not inconsistent with the objectives of the present disclosure. For example, in some cases, a matrix comprises or is formed from a metal. Any metal not inconsistent with the objectives of the present disclosure may be used. In some implementations, the matrix of a composite material described herein comprises or is formed from a metal selected from the group consisting of aluminum, aluminum alloys, copper, copper alloys, titanium, titanium alloys, stainless steel, brass, and combinations thereof.

In some instances, a matrix comprises or is formed from a non-metal material, such as a polymeric material. Any polymeric material not inconsistent with the objectives of the present invention may be used. In some cases, a polymeric material is selected from the group consisting of a thermoset material and a thermoplastic material. In some implementations, a matrix comprises or is formed from a polycarbonate, a polyethylene such as a high-density polyethylene, a polypropylene, a polyvinyl chloride (PVC), an acrylonitrile butadiene styrene (ABS) polymer, a maleimide or bismaleimide, a phenol formaldehyde polymer, a polyepoxide, a polyether ether ketone (PEEK) polymer, a polyetherimide (PEI), a polyimide, a polysulfone, or a combination of one or more of the foregoing.

Moreover, in some instances, the matrix of a composite material described herein comprises or is formed from one or more glass, ceramic or other refractory material, and carbon. A matrix can also comprise or be formed from a combination of a metal, polymeric material, glass material, ceramic material, and carbon material.

Composite materials described herein also comprise graphene particles dispersed in the matrix of the composite. Any graphene particles not inconsistent with the objectives of the present disclosure may be used. According to the present disclosure, one exemplary graphene particle is a one-atom thick planar sheet of $sp^2$-bonded carbon atoms that are densely packed in a honeycomb crystal lattice.

Graphene particles of a composite material described herein can have any size and shape not inconsistent with the objectives of the present disclosure. In some cases, for instance, graphene particles have an anisotropic shape, such as a rod or needle shape or a platelet shape. In some implementations, graphene particles comprise graphene platelets, nanosheets, or nanoplatelets formed from one or more atomic layers of graphene. Thus, in some implementations, a graphene particle described herein comprises, consists, or consists essentially of one or more graphene sheets. A graphene sheet, in some implementations, comprises a single molecular or atomic layer having a flat planar structure. Any number of graphene sheets not inconsistent with the objectives of the present disclosure may be used. In some implementations, a graphene particle comprises a plurality of graphene sheets. The plurality of graphene sheets, in some implementations, can be arranged in a randomly stacked or layered configuration. In other implementations, a graphene particle comprises or consists of a single randomly oriented graphene sheet. Therefore, in some implementations, a graphene particle described herein comprises 1 or more atomic layers of graphene. In some implementations, a graphene particle comprises between 1 and 10 atomic layers of graphene. In some implementations, a graphene particle comprises between 1 and 5 atomic layers or between 1 and 3 atomic layers of graphene. In other instances, a graphene particle comprises between 1 and 1000 atomic layers, between 1 and 500 atomic layers of graphene, or between 1 and 100 atomic layers of graphene.

Further, in some implementations comprising graphene platelets, the platelets have an average thickness of up to about 1000 nm or up to about 100 nm. In some instances, graphene platelets have an average thickness of about 0.3 nm to about 1 nm, about 1 nm to about 1000 nm, about 1 nm to about 100 nm, about 1 nm to about 10 nm, or about 300 nm to about 1000 nm. Moreover, in some cases, such graphene platelets have an average length and/or width of up to about 1 µm, up to about 1 cm, or up to about 5 cm. In some instances, graphene platelets or other graphene particles have an average length and/or an average width between about 1 µm and about 5 cm, between about 1 µm and about 1 cm, between about 1 µm and about 500 µm, between about 1 µm and about 100 µm, between about 1 µm and about 10 µm, between about 5 µm and about 1 cm, between about 5 µm and about 500 µm, between about 5 µm and about 100 µm, between about 10 µm and about 1 cm, between about 10 µm and about 500 µm, between about 10 µm and about 100 µm, between about 50 µm and about 1 cm, between about 100 µm and about 1 cm, or between about 100 µm and about 500 µm.

Additionally, in some implementations, anisotropic graphene particles have a random orientation within the matrix of a composite material described herein. For example, in some cases, the graphene is provided as a plurality of randomly oriented graphene platelets. A "random" orientation, for reference purposes herein, is relative to the direction of a unique axis of the anistropic particles. In some implementations, for instance, a random orientation comprises an orientation in which the Z axes of the particles are randomly oriented in three-dimensional space, where the Z axis of a particle can correspond to the thickness of the particle, as opposed to the length or width of the particle. Thus, randomly oriented particles can be contrasted with oriented or aligned particles. However, it is also possible for the graphene particles of a composite material described herein to have an aligned orientation within the matrix of the composite material.

FIG. 1 illustrates a graphene nanoplate 10 according to one aspect of the present disclosure. As can be seen in FIG. 1, the graphene nanoplatelet 10 has a length (L) along the X axis, a width (W) along the Y axis and a thickness or height (H) along the Z axis. In other words, the L and W of the nanoplate 10 lie oriented and/or aligned in the X-Y plane. Ordinarily, the L and W are the major dimensions of graphene nanoplatelet 10 and the graphene nanoplatelet is predominantly oriented and/or aligned in the X-Y plane. However, according to the present disclosure, it has now been shown that graphene has displayed beneficial and unexpected performance properties when it is presented in a random orientation. According to one variation, the L and W may be about 1 µm to about 1 cm. In another aspect, the L and W may be from about 5 µm to about 10 mm. In another aspect, the graphene nanoplatelets 10 have an average H of from about 1 to about 10 atomic layers. Additionally, in one aspect, graphene nanoplatelets 10 have a rectangular geometry in the X-Y plane, or may have other geometries including, but not limited to square, oval, hexagonal, or other polygonal geometries. Further, as technology develops, the present disclosure contemplates larger and smaller graphene platelet dimensions.

According to the present disclosure, graphene platelets, in some implementations, can have a thermal conductivity of about 5,300 (W/mK) in the X-Y plane. Incorporating such graphene platelets into or onto a substrate material can improve the thermal conductivity of the substrate material. According to one aspect, the graphene platelets are preferably distributed within a substrate material, such as, for example, a material matrix, to produce a composite material having an increased thermal conductivity across in one or more dimensions.

Graphene particles described herein can be present in a composite material in any amount not inconsistent with the objectives of the present disclosure. In some cases, for instance, the composite material comprises graphene particles in an amount of from about 1 volume % to about 90 volume %, based on the total volume of the composite material. In another variation, the matrix material comprises graphene particles in an amount of from about 1 volume % to about 60 volume %, about 1 volume % to about 40 volume %, about 1 volume % to about 20 volume %, or about 1 volume % to about 10 volume %. In yet another variation, the matrix material comprises graphene particles in an amount of from about 5 volume % to about 30 volume % or about 5 volume % to about 20 volume %. In still another variation, the matrix material comprises graphene particles in an amount of from about 5 volume % to about 10 volume %. In a further variation, the matrix material comprises graphene particles in an amount of from about 1 volume % to about 5 volume %. In addition, in some cases, the amount of graphene dispersed in a matrix described here in selected based on the thermal conductivity of the matrix and/or a desired thermal conductivity of the composite material. For example, in some instances, a higher amount of graphene is added to a matrix material having a lower thermal conductivity. In particular, in some implementations comprising a non-conductive or minimally conductive matrix material such as some polymeric matrix materials described herein, graphene particles are dispersed in the matrix in an amount above the percolation limit. In some implementations, graphene particles dispersed in the matrix in an amount above the percolation limit are present in a concentration sufficiently high to provide a continuous network of graphene particles within the matrix. Such a continuous network can be formed by graphene particles in direct physical contact with one another. Similarly, in other cases, rather than using a higher amount of graphene, a lower amount of graphene can be added to a matrix material having a higher thermal conductivity.

Moreover, in some implementations, the size, shape, and volume % of graphene particles in a matrix described herein are selected to have a minimal impact on the mechanical properties and/or processibility of the matrix material. For example, in some cases, graphene platelets having a thickness of up to about 10 nm, a width of up to about 100 mm, and a length of up to about 1 cm are used in an amount up to about 20 volume %. In some such instances, the tensile strength and/or tensile modulus of the matrix material is altered by less than about 20%, less than about 15%, less than about 10%, or less than about 5% by the inclusion of the graphene platelets, based on the tensile strength and/or tensile modulus of the matrix material without any graphene platelets. The tensile strength and/or tensile modulus of a matrix or composite material can be measured in any manner not inconsistent with the objectives of the present disclosure. In some cases, the tensile strength and/or tensile modulus is measured by ASTM D3552 or ASTM E8. In some implementations, the Charpy impact and/or ductile-brittle transition temperature (DBTT) of the matrix material is altered by less than about 15%, less than about 10%, less than about 5%, or less than about 1% by the inclusion of the graphene platelets, based on the Charpy impact and/or DBTT of the matrix material without any graphene platelets. The Charpy impact and/or DBTT of a matrix or composite material can be measured in any manner not inconsistent with the objectives of the present disclosure. In some cases, the Charpy impact and/or DBTT is measured by a four-point bending test at a range of temperatures or in a manner according to ASTM A370 and/or ASTM E23.

A composite material described herein can be manufactured in any manner not inconsistent with the objectives of the present disclosure, including the following exemplary processes. In one process, graphene particles such as graphene platelets are provided in a dry form or in a dispersed form in a solvent. If provided in a solvent, the graphene particles can be dispersed in a solvent having a low boiling point such as, for example, acetone, alcohol, or a similar solvent. The graphene particles are then introduced to a thin metal or polymeric mesh or other porous network, including an isotropic or randomly oriented mesh or network. The graphene particles are captured on or within the mesh or network, and the solvent is removed by heating to form the composite material. In one variation, the mesh or network is formed from a metal such as aluminum, aluminum alloy, copper, copper alloy, titanium, titanium alloy, stainless steel, brass, or a combination thereof. If desired, the process may be repeated with multiple layers stacked to form a composite building block. According to one variation, the composite block may be further hot and/or cold worked to reach a desired thickness and density. Shaping may then be performed by any method to achieve a desired shape.

In another variation, the graphene composite can be formed by hot melting and/or extruding a graphene/matrix mixture. According to another variation, a graphene composite is formed by forming graphene layers in a loosely connected thin sheet form with a metal matrix by hot melt or electrolytic/electrolysis plating to form a composite building block. The composite building blocks can then be processed as described above if desired. For example, the composite building blocks can be stacked, hot pressed, cold formed and/or machined/shaped. In a further implementation, graphene-containing composites may be formed using randomly oriented graphene sheets and conventional powder metallurgical processing.

In another aspect, thermally conductive materials are described herein. Such a thermally conductive material comprises a composite material described herein. Any composite material described hereinabove may be used. Similarly, in another aspect, thermally conductive components are described herein. Such a component can include a thermally conductive material comprising a composite material described herein. Further, the component can have any form or be used for any purpose not inconsistent with the objectives of the present disclosures. In some cases, for instance, a thermally conductive component is a heat spreader, a heat sink, or other thermal management component. Thus, the present disclosure is also directed to thermal management and thermal conduction applications. In some implementations, for example, methods of thermally managing a heat-generating component such as an electronic component are described herein. In some cases, such a method comprises contacting a thermally conductive material described herein and a heat-generating component, and transferring thermal energy from the heat-generating component to the thermally conductive material. Moreover, in some implementations, the method further comprises dissipating the transferred thermal energy, including by means of conduction cooling with a fluid such as air or a liquid coolant. Thermal energy transferred to the thermally conductive material can also be dissipated in other ways.

The following Example illustrates one use for graphene-containing composite materials disclosed herein; namely, the use of such composite materials to provide thermal management for electronic components.

EXAMPLE

Composite Materials

Graphene-containing composite materials according to some implementations described herein are formed by extrusion of either (1) a mixture of aluminum and graphene platelets or (2) a mixture of a composite plastic material (graphite-reinforced plastic) and graphene platelets. The graphene platelets have a random orientation within the aluminum or composite material matrix. The loading of graphene platelets is 10 volume %, based on the total volume of the composite material. The composite materials are then formed into heat spreaders for use with an electronic component. The thermal conduction properties of the composite materials are compared to the thermal conduction properties of heat spreaders having the same form factor but formed from (3) a mixture of aluminum with aluminum plates dispersed in the aluminum matrix or (4) aluminum plates dispersed in the graphite-reinforced plastic. The aluminum plates have the same dimensions and loading as the graphene platelets. The four heat spreaders (experimental heat spreaders (1) and (2) and comparative heat spreaders (3) and (4)) are then used for conduction cooling of an electronic device. The peak temperature of the device is then measured as a function of time for each heat spreader. It was found that heat spreaders formed from a composite material described herein provide improved results compared to heat spreaders that do not include graphene platelets. For example, heat spreader (1) provides a device temperature about 10-15° C. lower than heat spreader (3) at time points between about 500 and 600 seconds, corresponding to a temperature reduction of about 9 to 14%, where the percentage is based on the temperature difference divided by the temperature provided by heat spreader (3).

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. A composite material comprising:
    a polymeric matrix comprising a polycarbonate, a polyethylene, a polypropylene, a polyvinyl chloride (PVC), an acrylonitrile butadiene styrene (ABS) polymer, a maleimide or bismaleimide, a phenol formaldehyde polymer, a polyepoxide, a polyether ether ketone (PEEK) polymer, a polyetherimide (PEI), a polyimide, a polysulfone, or a combination thereof; and
    a plurality of graphene platelets dispersed in the polymeric matrix;
wherein the plurality of graphene platelets have an anisotropic shape, the plurality of graphene platelets have an average thickness of about 300 nm to about 1000 nm, the plurality of graphene platelets have an average length between about 1 µm to about 5 cm, the plurality of graphene platelets are randomly oriented in the polymeric matrix relative to a direction of a unique axis of the anisotropic shaped plurality of graphene particles, an amount of graphene platelets is from about 5 volume % to about 30 volume % of the composite material, and wherein the composite material exhibits a ductile-brittle transition temperature within about 15% of the ductile-brittle transition temperature of the polymeric matrix without any graphene platelets or a tensile strength within about 20% of the tensile strength of the polymeric matrix without any graphene platelets.

2. The composite material of claim 1, wherein the polymeric matrix comprises one or more of a thermoset material or a thermoplastic material.

3. The composite material of claim 1, wherein the graphene platelets have an average width of about 1 µm to about 5 cm.

4. The composite material of claim 1, wherein the graphene platelets have an average length and an average width of about 1 µm to about 1 cm.

5. The composite material of claim 1, wherein the composite material comprises the graphene platelets in an amount of from about 5% to about 10% by volume, based on the total volume of the composite material.

6. The composite material of claim 1, wherein the composite material exhibits a ductile-brittle transition temperature within about 10% of the ductile-brittle transition temperature of the polymeric matrix without any graphene platelets.

7. The composite material of claim 1, wherein the composite material exhibits a tensile strength within about 15% of the tensile strength of the polymeric matrix without any graphene platelets.

8. The composite material of claim 1, wherein:
    the platelets have an average width of about 1 µm to about 5 cm; and
    the composite material comprises the graphene platelets in an amount of from about 5% to about 10% by volume, based on the total volume of the matrix.

9. The composite material of claim 8, wherein the composite material exhibits a ductile-brittle transition temperature within about 15% of the ductile-brittle transition temperature of the polymeric matrix without any graphene platelets and a tensile strength within about 20% of the tensile strength of the polymeric matrix without any graphene platelets.

10. The composite material of claim 1, wherein the polyethylene is a high-density polyethylene.

11. The composite material of claim 1, wherein the composite material exhibits a ductile-brittle transition temperature within about 5% of the ductile-brittle transition temperature of the polymeric matrix without any graphene platelets.

12. The composite material of claim 1, wherein the composite material exhibits a ductile-brittle transition temperature within about 1% of the ductile-brittle transition temperature of the polymeric matrix without any graphene platelets.

13. The composite material of claim 1, wherein the composite material exhibits a tensile strength within about 10% of the tensile strength of the polymeric matrix without any graphene platelets.

14. The composite material of claim 1, wherein the composite material exhibits a tensile strength within about 5% of the tensile strength of the polymeric matrix without any graphene platelets.

15. The composite material of claim 1, wherein the composite material exhibits a tensile strength within about 1% of the tensile strength of the polymeric matrix without any graphene platelets.

16. The composite material of claim 1, wherein the graphene platelets have an average length of about 1 µm to about 500 µm.

17. The composite material of claim 1, wherein the graphene platelets have an average length of about 1 μm to about 100 μm.

18. The composite material of claim 1, wherein the graphene platelets have an average length of about 1 μm to about 10 μm.

19. The composite material of claim 1, wherein the graphene platelets have an average width of about 1 μm to about 100 μm.

20. The composite material of claim 1, wherein the graphene platelets have an average width of about 1 μm to about 100 μm.

\* \* \* \* \*